US005624872A

United States Patent [19]

Liu

[11] Patent Number: 5,624,872

[45] Date of Patent: Apr. 29, 1997

[54] METHOD OF MAKING LOW CAPACITANCE FIELD EMISSION DEVICE

[75] Inventor: Nan-Chou D. Liu, Chutung, Taiwan

[73] Assignee: Industrial Technology Research Institute, Hsinchu, Taiwan

[21] Appl. No.: 628,069

[22] Filed: Apr. 8, 1996

[51] Int. Cl.[6] .................................................. H01L 21/465

[52] U.S. Cl. ................................ 216/11; 445/24; 445/50; 438/20

[58] Field of Search ........................ 445/24, 50; 437/228; 156/643; 313/306, 309, 336, 351, 495, 497

[56] References Cited

U.S. PATENT DOCUMENTS

| | | | |
|---|---|---|---|
| 4,964,946 | 10/1990 | Gray et al. | 156/643 |
| 5,064,396 | 11/1991 | Spindt | 445/50 |
| 5,075,591 | 12/1991 | Holmberg | 313/495 |
| 5,226,530 | 7/1993 | Bagley et al. | 437/228 |
| 5,229,331 | 7/1993 | Doan et al. | 437/228 |
| 5,320,570 | 6/1994 | Kane | 445/24 |
| 5,394,006 | 2/1995 | Liu | 257/506 |
| 5,461,009 | 10/1995 | Huang et al. | 437/228 |
| 5,496,200 | 3/1996 | Yang et al. | 445/25 |

*Primary Examiner*—John Niebling
*Assistant Examiner*—Richard A. Booth
*Attorney, Agent, or Firm*—George O. Saile

[57] ABSTRACT

A process is described for manufacturing a field emission device that has low capacitance as well as low internal resistance. The process begins with the provision of an insulating substrate on which cathode columns and orthonal gate lines, separated by a relatively thick insulating layer (to reduce capacitance), have been formed. Openings in the gate lines, located above the cathode columns and extending down to the level of the insulating layer, are then formed. Using the gate lines as a mask, the insulating layer is then etched down to the level of the cathode columns, thereby forming wells in the insulating layer. These wells are then filled with additional conductive material which is then partially removed. This results in the formation of conductive pedestals, inside the wells, on which the microtips (which are then formed in the usual manner) rest. This allows the microtips to retain electrical contact with the cathode columns while still keeping their apexes in line with the gate line openings.

20 Claims, 4 Drawing Sheets

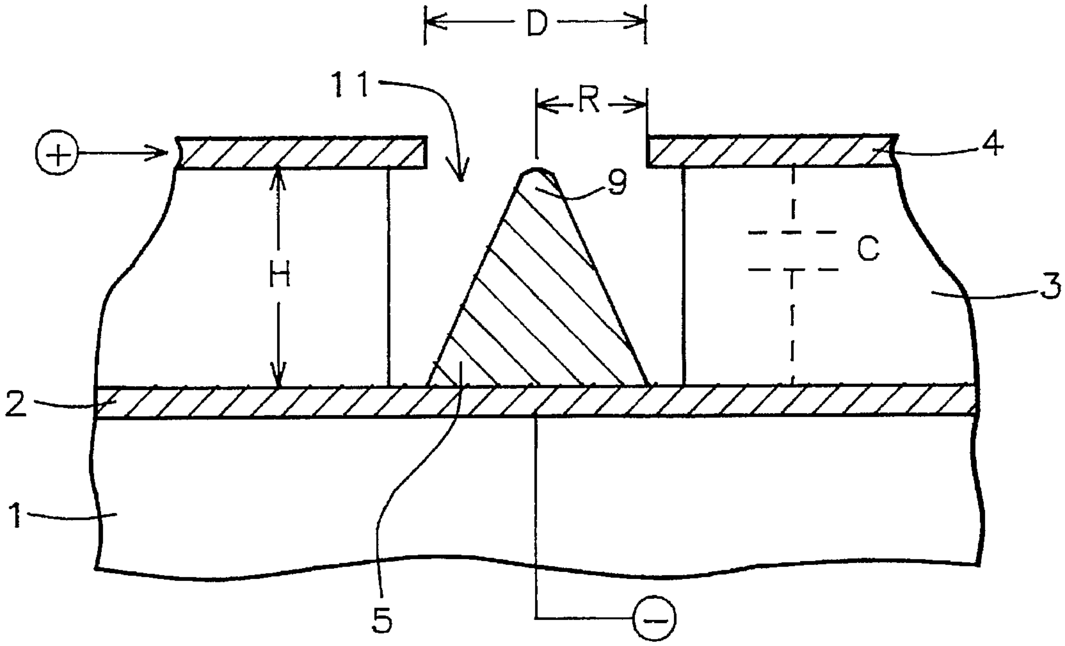
FIG. 1 - Prior Art
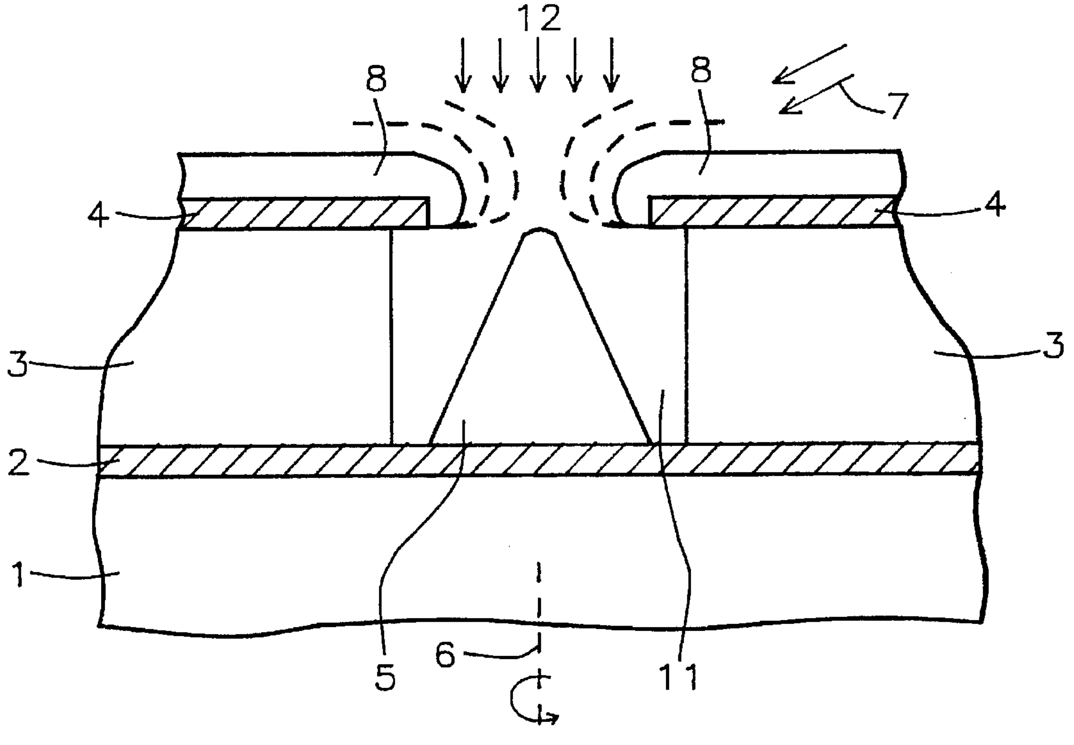
FIG. 2 - prior Art

METHOD OF MAKING LOW CAPACITANCE FIELD EMISSION DEVICE

BACKGROUND OF THE INVENTION (1) Field of the Invention

The invention relates to field emission devices in general and, more particularly, to their design and manufacture.

(2) Description of the Prior Art

Cold cathode electron emission devices are based on the phenomenon of high field emission wherein electrons can be emitted into a vacuum from a room temperature source if the local electric field at the surface in question is high enough. The creation of such high local electric fields does not necessarily require the application of very high voltage, provided the emitting surface has a sufficiently small radius of curvature.

The advent of semiconductor integrated circuit technology made possible the development and mass production of arrays of cold cathode emitters of this type. In most cases, cold cathode field emission displays comprise an array of very small conical emitters, each of which is connected to a source of negative voltage via a cathode conductor line or column. Another set of conductive lines (called gate lines) is located a short distance above the cathode lines and is orthogonally disposed relative to them, intersecting with them at the locations of the conical emitters or microtips, and connected to a source of positive voltage.

The electrons that are emitted by the cold cathodes accelerate past openings in the gate lines and strike an cathodoluminescent panel that is located a short distance from the gate lines. In general, a significant number of microtips serve together as a single pixel for the total display. Note that, even though the local electric field in the immediate vicinity of a microtip is in excess of 10 million volts/cm., the externally applied voltage is only of the order of 100 volts.

In FIG. 1 we show, in schematic cross-section, the basic elements of a typical cold cathode display. Metallic lines 2 are formed on the surface of an insulating substrate 1. Said lines are referred to as cathode columns. At regular intervals along the cathode columns, microtips 5 are formed. These are typically cones of height about one micron and base diameter about one micron and comprise molybdenum or silicon, though other materials may also be used. In many embodiments of the prior art, local ballast resistors (not shown here) may be in place between the cones and the cathode columns.

Metallic lines 4 are formed at right angles to the cathode columns, intersecting them at the locations of the microtips. A layer of insulation 3 supports lines 4, which are generally known as gate lines, placing them at the top level of the microtips, that is at the level of the apexes 9 of the cones 5. Openings 11 in the gate lines 4, directly over the microtips, allow streams of electrons to emerge from the tips when sufficient voltage is applied between the gate lines and the cathode columns. Because of the local high fields right at the surface of the microtips, relatively modest voltages, of the order of 100 volts are sufficient.

After emerging through the openings 11 in the gate lines, electrons are further accelerated so that they strike a fluorescent screen (not shown) where they emit visible light. Said fluorescent screen is separated from the cold cathode assembly by spacers (not shown) and the space between these two assemblies is evacuated to provide and maintain a vacuum of the order of $10^{-7}$ torr.

Continuing our reference to FIG. 1, note should be made of several important design parameters. The smaller the distance R, that is the distance between microtip apex 9 and gate electrode 4, the greater the electric field at 9 and hence the greater the electron emission current for a given applied voltage. The methods normally used for manufacturing the microtips (see below) lead to a geometry wherein the diameter D of the well or cavity 11, inside which the microtips are formed, is approximately equal to the depth H of the cavity. Thus, to minimize R it is normally necessary to similarly minimize H. However, the capacitance between a pair of intersecting cathode and gate lines (shown schematically as C) is inversely proportional to H so a reduction in R is normally associated with an increase in C. Such an increase in capacitance is undesirable because it causes an increase in power consumption and in the time constant of the emitter.

The conventional method for forming microtips has been described by Spindt in U.S. Pat. No. 5,064,396 Nov. 1991 and is schematically illustrated in FIG. 2. Cathode lines 2 are formed on substrate 1. Gate lines 4 are formed so as to run at right angles to lines 2, being separated from them by insulating layer 3. Well or cavity 11 is formed in layer 3 by first forming an opening in gate layer 4 and then using 4 as a mask for the etching of 3. Etching is continued past the minimum time needed to reach layer 2 so a certain amount of undercutting of layer 4 at the top of 11 occurs.

The entire assemblage is now placed in a vacuum chamber and rotated about a centrally located vertical axis, such as 6. While rotation occurs, an evaporant beam 7 of a suitable release material (also called a sacrificial material), such as silicon oxide, is directed at the surface of 4 at close to grazing incidence. This begins a gradual buildup of release material 8 at the entrance to cavity 11. Then, with evaporant beam 7 still active, a vertically directed beam 12 of material suitable for a microtip emitter (such as molybdenum or silicon) is started. Material from beam 12 then builds up inside cavity 11 in the shape of cone 5 because the entrance to 11 is gradually closing.

Once the closure of 11 is complete the evaporation processes are terminated and the entire structure is allowed to soak in an etchant that selectively attacks release material 8 and nothing else. As material 8 disintegrates, material from 12 that had been deposited so as to be in contact with 8 get lifted off and eventually completely removed so that the finished device has the appearance seen in FIG. 1.

Returning now to the design problems mentioned above, a solution has been provided by Spindt (U.S. Pat. No. 5,064,396). In his process, layer 3 (in FIG. 1) is initially made twice as thick, other dimensions remaining unchanged. Cone 5 is then formed as described above resulting in a microtip whose height is half that of the cavity. After liftoff, the entire cone formation process is repeated once again, resulting in a tall slim cone whose apex is once more at the level of gate layer 4. While this method cuts the capacitance in half without reducing emission current, it significantly increases the cost of manufacturing the device. There is also some increase in the series resistance associated with the use of a longer slimmer cone.

Holmberg (U.S. Pat. No. 5,075,591 Dec 1991) avoids the use of two cone formation steps. Instead, two layers of insulation are used Co form the equivalent of layer 3 (FIG. 1), the topmost of these being removed only in the immediate vicinity of cavity 11. Layer 4 is formed so as to lie mainly on both insulation layers but does extend all the way to openings 11. Thus most of capacitor C derives its magnitude from the thickness of the double insulation layer. This approach, however, also increases the manufacturing costs. Additionally, the geometry of the structure limits the extent to which evaporant beams may be effectively used at grazing incidence as well as introducing the possibility of discontinuties in layer 4 at the step down to the cavity.

Kane (U.S. Pat. No. 5,320,570 Jun 1994) provides a solution wherein only a single cone formation step is used but, rather than having the cones lie directly on layer 2 (FIG. 1), insulating layer 3 is made thicker and the depth of cavity 11 is extended. A column, or pedestal, is then provided for the cone to rest on so that the cone remains electrically connected to cathode line 2 while its apex is raised so as to be level with the opening of cavity 11. In Kane's structure, both the pedestals and the cathode lines are formed from the same initial layer of metal. This makes it difficult to impossible to, for example, provide individual ballast resistors for the microtips. Additionally, since the pedestals are formed prior to the formation of the openings in gate lines 4, a very precise alignment step is needed to ensure that each cavity 11 is exactly lined up with its intended pedestal.

Thus, the structure that is the end product of the process of the present invention is similar to that of Kane in that pedestals are also used to support the cones inside a deeper cavity. However, the process of the present invention is simpler and more flexible than Kane's process.

SUMMARY OF THE INVENTION

It has been an object of the present invention to provide a process for manufacturing a field emission device that has low capacitance and low internal resistance.

A further object of the present invention has been that said process should be low cost, have high throughput for microtip formation, and be flexible in its application.

Yet another object of the present invention has been that the provided process not require time consuming and delicate alignment procedures in its application.

These objects have been achieved by providing a process that begins with the provision of an insulating substrate on which cathode columns and orthonal gate lines, separated by a relatively thick insulating layer (to reduce capacitance), have been formed. Openings are then made in the gate lines, said openings being located above the cathode columns and extending down to the level of the insulating layer. Using the gate lines as a mask, the insulating layer is then etched down to the level of the cathode columns, thereby forming wells in the insulating layer.

These wells are then filled with additional conductive material which is then partially removed from inside the wells. This results in the formation of conductive pedestals, inside the wells, on which the microtips (which are then formed in the usual way) rest. This allows the microtips to retain electrical contact with the cathode columns while keeping their apexes in line with the gate line openings.

BRIEF DESCRIPTION OF THE DRAWINGS

FIG. 1 is a schematic cross-section of a field emission device.

FIG. 2 illustrates the process whereby microtip emitters are formed.

DESCRIPTION OF THE PREFERRED EMBODIMENTS

Figure 3:
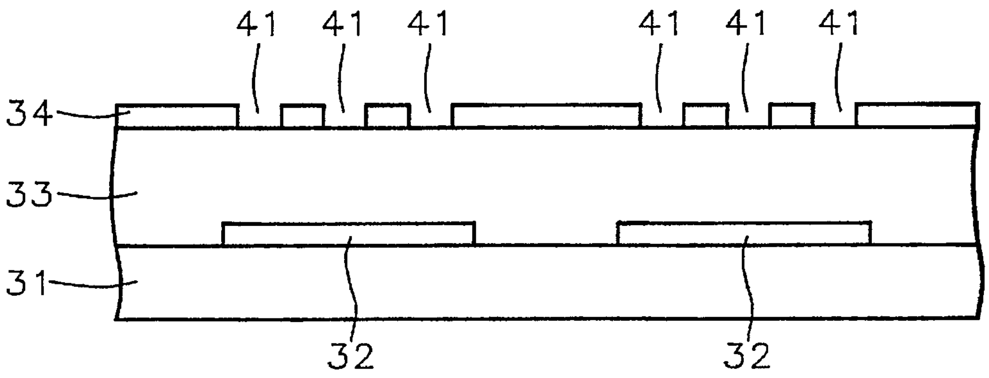
FIG. 3 illustrates the structure that comprises the starting point for applying the process of the present invention.

Referring now to FIG. 3, the process of the present invention begins with the provision of insulating substrate 31 on whose surface cathode columns 32 have been formed. Insulating layer 33 is then deposited so as to cover both the substrate and the cathode columns. For layer 33 we have typically used silicon oxide, but other insulating materials such as glass paste could also have been used. Our preferred thickness for 33 has been about 5 microns, but any thickness in the range from about 2 to 20 microns would work. If needed, the surface may now be planarized using a standard method such as chemical mechanical polishing (CMP). This is followed by the deposition of metallic layer 34 which is then patterned and etched to form gate lines which run orthogonally relative to cathode columns 32. Openings 41 are then etched in gate lines 34, down to the level of insulating layer 33, giving the structure the appearance seen in FIG. 3. In general, the openings are circular in shape and have a diameter between about 0.5 and 1 microns.

Figure 4:
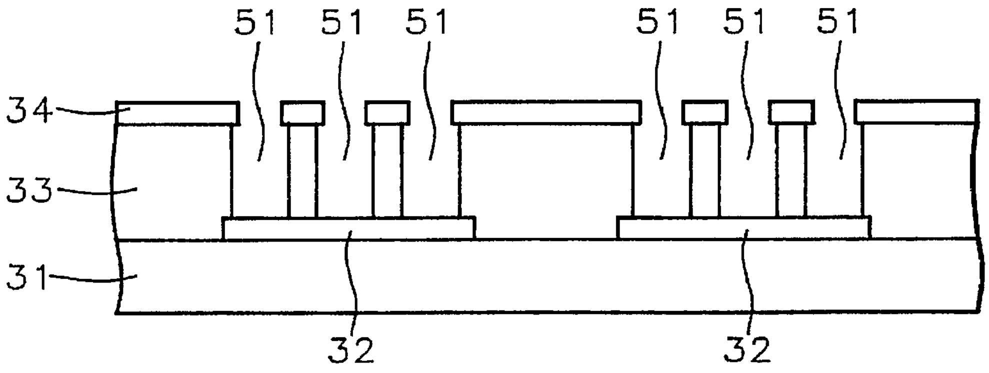
FIGS. 4 through 8 illustrate successive steps in the application of the process of the present invention.

Using gate lines 34 as a mask, insulating layer 33 is now etched, using an anistropic etching method such as reactive ion etching, down to the level of cathode columns 32, thereby forming wells 51 in insulating layer 33. At this point the structure is as seen in FIG. 4.

Figure 5:
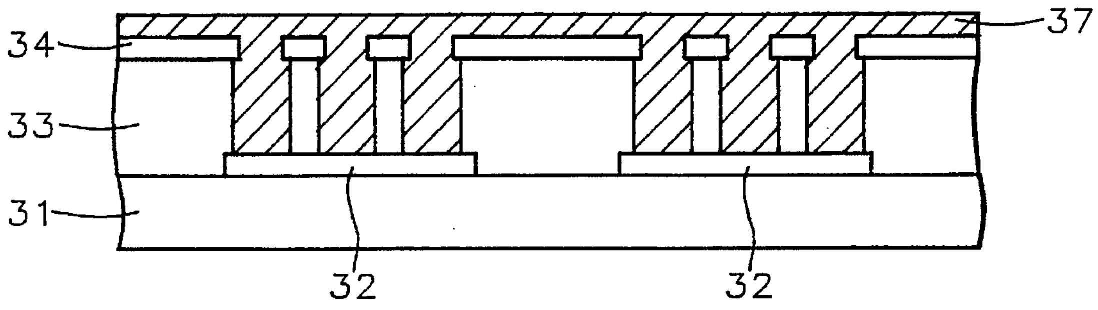

Referring now to FIG. 5, conductive layer 37, comprising silicon or molybdenum, is deposited onto the structure to a thickness that is sufficient to fill wells 51. Any of several possible methods for depositing 37 may be used. These include, but are not limited to, evaporation, sputtering, electroplating, and electroless plating. After deposition, layer 37 is planarized, using CMP or some similar technique, giving the structure the appearance shown. In FIG. 5, layer 37, after planarization, is shown as extending above the level of layer 4. In an alternative embodiment of the present invention, planarization is allowed to proceed to the point where gate lines 34 are fully exposed (not shown).

Figure 6:
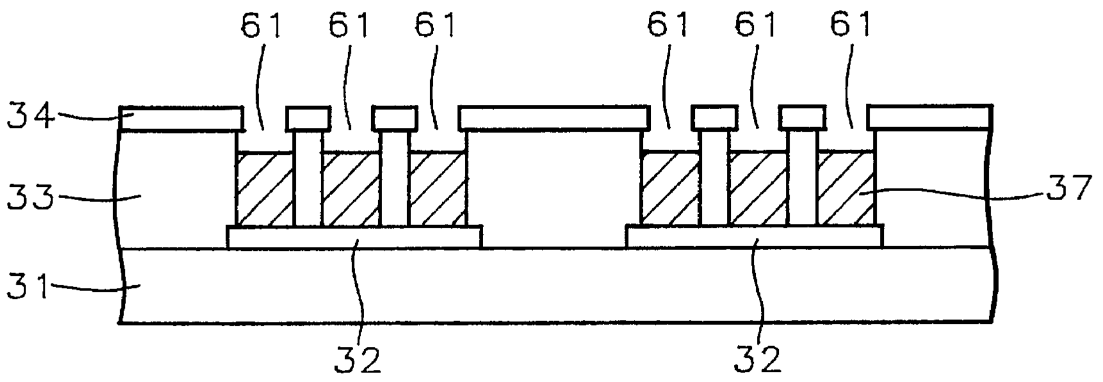

Layer 37 is now etched. Once the etch front passes the lower surface of layer 34 (which is not attacked) it enters the filled wells 51 and begins the removal of material 37 from inside them. When the depth of the empty portion of the wells (now designated as 61 in FIG. 6) is between about 0.5 and 1 microns, etching is terminated, giving the structure the appearance seen in FIG. 6. The depth of the wells was controlled by use of time mode etching. After etching, the actual depth was measured and, when necessary, the process for forming the microtips was adjusted accordingly. Some additional etching of insulating layer 33 may be provided at this point in the process. This extra step is optional and is determined by the extent to which undercutting of layer 34, where it overhangs 61, is desired.

Figure 7:
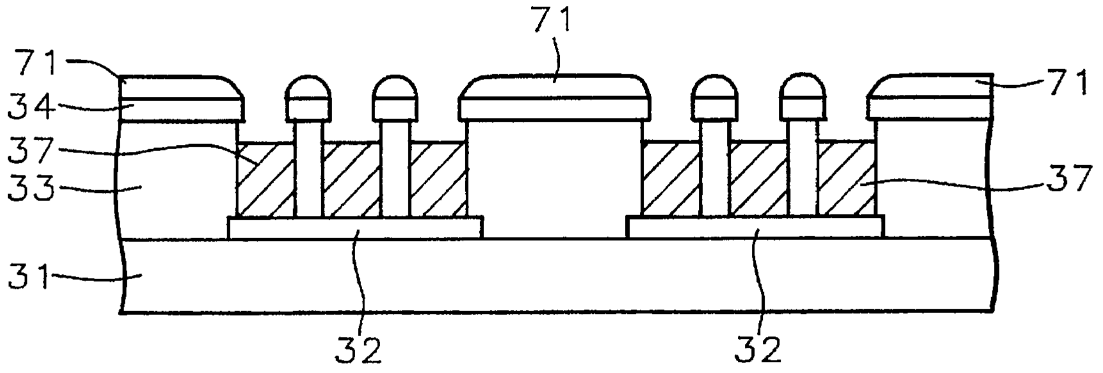

The entire assemblage is now placed under vacuum and rotated about an axis normal to the substrate. A suitable release material such as aluminum or aluminum oxide, which will serve as a sacrificial layer, is evaporated from a source located to one side. It is arranged that the beam of release material evaporant arrives at the substrate surface at a grazing angle. Continuing the rotation at the same time ensures that the top surface, as well as the inward facing edges of layer 34 that surround the openings to wells 61, get uniformly coated. In this way, the partial closing of these openings by release layer 71 (in FIG. 7) begins.

Figure 8:
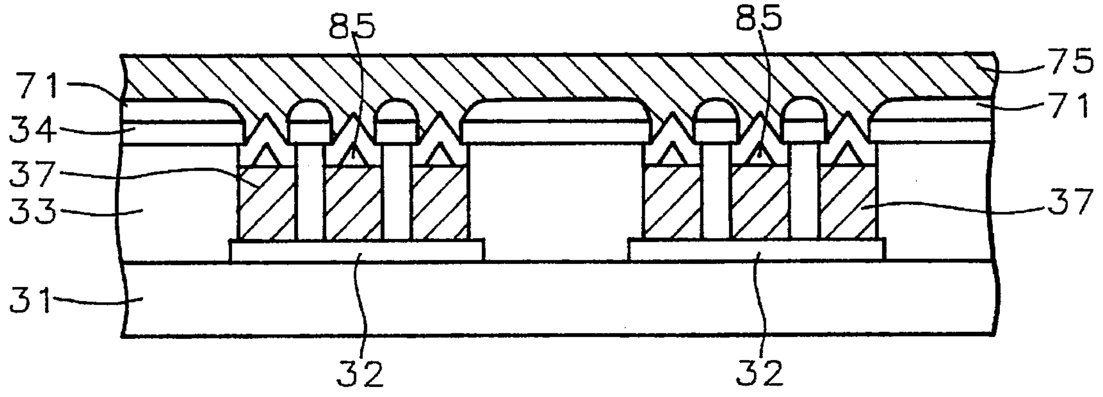

Without stopping either the rotation or the grazing angle application of release material 71, an evaporant beam of a material such as molybdenum or silicon, that is suitable for the formation of a field emission microtip, is directed at the substrate at normal incidence to it. This causes material to build up in the shape of cones inside 61 because the entrance to 61 is gradually closing. Material also merges with and deposits on top of layer 71 to form layer 75, as illustrated in FIG. 8. The cones have been designated as 85 in FIG. 8.

Figure 9:
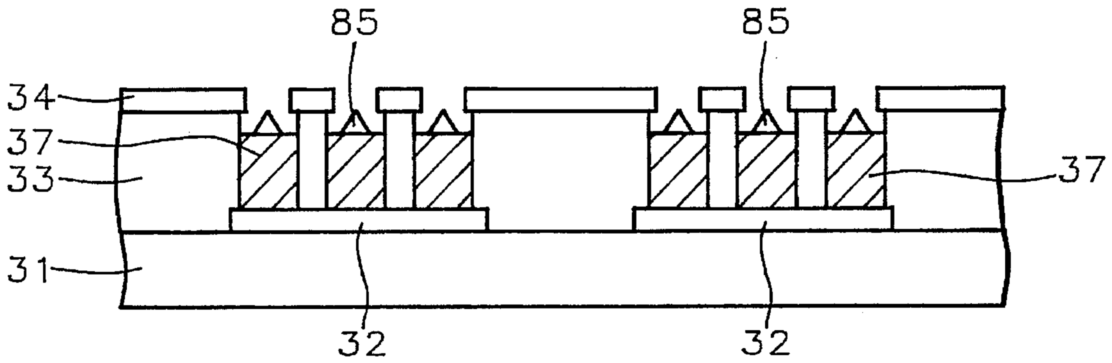
FIG. 9 shows the structure that is the end product of the process of the present invention.

The process is completed by selectively etching away release layer 71 using hydrochloric acid when layer 71 was of aluminum. This causes the lift-off of everything above it, notably layer 75, but leaves the cones 85 intact. The appearance of the structure at the completion of the process is illustrated in FIG. 9.

While the invention has been particularly shown and described with reference to the preferred embodiments thereof, it will be understood by those skilled in the art that various changes in form and details may be made without departing from the spirit and scope of the invention.

What is claimed is:

1. A method for manufacturing a low capacitance field emission device comprising:

(a) providing an insulating substrate having an upper surface and forming cathode columns on said upper surface;

(b) depositing an insulating layer on said upper surface and on said cathode columns;

(c) depositing a first conductive layer on said insulating layer and then patterning and etching said first conductive layer to form gate lines orthogonal to said cathode columns;

(d) forming openings in the gate lines, said openings being located above said cathode columns and extending down to the level of said insulating layer;

(e) etching said insulating layer, through said gate line openings, down to the level of the cathode columns, thereby forming wells in said insulating layer;

(f) depositing a second conductive layer, having an upper surface, on said gate lines to a thickness that is sufficient to fill said wells;

(g) planarizing the upper surface of the second conductive layer without exposing the gate lines;

(h) selectively etching the planarized second conductive layer until said gate lines have been fully exposed and said second conductive layer has been partially removed from inside the wells;

(i) rotating said substrate, including the partially filled wells, about an axis normal to said substrate surface and, under vacuum, depositing an evaporant beam of a release material to said substrate at a grazing angle, thereby partially closing said openings in the gate lines;

(j) then, while continuing the grazing angle application of said release material, depositing, at normal incidence, an evaporant beam of an emitter material to said substrate until said openings in the gate lines have been fully covered over, thereby forming microcones inside the wells; and (k) selectively etching away the deposited release material thereby causing lift-off of said emitter material everywhere except inside the wells.

2. The method of claim 1 wherein said insulating layer comprises silicon oxide or glass paste.

3. The method of claim 1 wherein said insulating layer is deposited to a thickness between about 2 and about 20 microns.

4. The method of claim 1 wherein said openings in the gate lines have a circular shape and a diameter between about 0.5 and 1 microns.

5. The method of claim 1 wherein said second conductive layer comprises silicon or molybdenum.

6. The method of claim 1 wherein planarizing is achieved by means of chemical-mechanical polishing or lapping.

7. The method of claim 1 wherein the depth of the wells, after the partial removal of said second conductive layer, is between about 0.5 and 1 microns.

8. The method of claim 1 further comprising, between steps (h) and (i), the additional step of briefly and selectively etching said insulating material so as to widen the wells without widening the gate openings.

9. The method of claim 1 wherein the release material comprises aluminum or aluminum oxide.

10. The method of claim 1 wherein the emitter material comprises molybdenum or silicon.

11. A method for manufacturing a low capacitance field emission device comprising:

(a) providing an insulating substrate having an upper surface and forming cathode columns on said upper surface;

(b) depositing an insulating layer on said upper surface and on said cathode columns;

(c) depositing a first conductive layer on said insulating layer and then patterning and etching said first conductive layer to form gate lines orthogonal to said cathode columns;

(d) forming openings in the gate lines, said openings being located above said cathode columns and extending down to the level of said insulating layer;

(e) etching said insulating layer, through said gate line openings, down to the level of the cathode columns, thereby forming wells in said insulating layer;

(f) depositing a second conductive layer, having an upper surface, on said gate lines to a thickness that is sufficient to fill said wells;

(g) planarizing the upper surface of the second conductive layer and then removing enough of said second conductive layer to fully expose the gate lines;

(h) selectively etching the planarized second conductive layer until said second conductive layer has been partially removed from inside the wells;

(i) rotating said substrate, including the partially filled wells, about an axis normal to said substrate surface and, under vacuum, depositing an evaporant beam of a release material to said substrate at a grazing angle, thereby partially closing said openings in the gate lines;

(j) then, while continuing the grazing angle application of said release material, depositing, at normal incidence, an evaporant beam of an emitter material to said substrate until said openings in the gate lines have been fully covered over, thereby forming microcones inside the wells; and (k) selectively etching away the deposited release material thereby causing lift-off of said emitter material everywhere except inside the wells.

12. The method of claim 11 wherein said insulating layer comprises silicon oxide or glass paste.

13. The method of claim 11 wherein said insulating layer is deposited to a thickness between about 2 and about 20 microns.

14. The method of claim 11 wherein said openings in the gate lines have a circular shape and a diameter between about 0.5 and 1 microns.

15. The method of claim 11 wherein said second conductive layer comprises silicon or molybdenum.

16. The method of claim 11 wherein planarizing is achieved by means of chemical-mechanical polishing or lapping.

17. The method of claim 11 wherein the depth of the wells, after the partial removal of said second conductive layer, is between about 0.5 and 1 microns.

18. The method of claim 11 further comprising, between steps (h) and (i), the additional step of briefly and selectively etching said insulating material so as to widen the wells without widening the gate openings.

19. The method of claim 11 wherein the release material comprises aluminum or aluminum oxide.

20. The method of claim 11 wherein the emitter material comprises molybdenum or silicon.

* * * * *